(12) United States Patent
Nomoto et al.

(10) Patent No.: US 6,985,505 B2
(45) Date of Patent: Jan. 10, 2006

(54) SEMICONDUCTOR LASER DIODE AND OPTICAL MODULE

(75) Inventors: Etsuko Nomoto, Sagamihara (JP); Kouji Nakahara, Kunitachi (JP); Shinji Tsuji, Hidaka (JP); Makoto Shimaoka, Ushiku (JP)

(73) Assignee: Opnext Japan, Inc., Kanagawa (JP)

( * ) Notice: Subject to any disclaimer, the term of this patent is extended or adjusted under 35 U.S.C. 154(b) by 0 days.

(21) Appl. No.: 11/130,150

(22) Filed: May 17, 2005

(65) Prior Publication Data

US 2005/0207463 A1  Sep. 22, 2005

Related U.S. Application Data

(63) Continuation of application No. 10/229,060, filed on Aug. 28, 2002, now abandoned.

(30) Foreign Application Priority Data

Mar. 1, 2002 (JP) ............................. 2002-055852

(51) Int. Cl.
*H01S 3/04* (2006.01)
*H01S 5/00* (2006.01)

(52) U.S. Cl. ................. 372/49.01; 372/43.01
(58) Field of Classification Search ............. 372/43.01, 372/45.01
See application file for complete search history.

(56) References Cited

U.S. PATENT DOCUMENTS

| | | | | |
|---|---|---|---|---|
| 5,022,036 A | * | 6/1991 | Suyama et al. | .......... 372/45.01 |
| 5,418,374 A | | 5/1995 | Morita et al. | |
| 5,675,601 A | | 10/1997 | Karakida et al. | |
| 5,721,752 A | * | 2/1998 | Takagi | ..................... 372/49.01 |
| 5,727,008 A | * | 3/1998 | Koga | ...................... 372/43.01 |
| 5,900,647 A | * | 5/1999 | Inoguchi | ...................... 257/76 |
| 6,018,539 A | | 1/2000 | Kimura et al. | |
| 6,529,537 B2 | * | 3/2003 | Yamanaka | ............... 372/49.01 |
| 6,563,140 B1 | * | 5/2003 | Nakamura et al. | ............ 257/94 |

(Continued)

FOREIGN PATENT DOCUMENTS

JP  03-206678  1/1990

(Continued)

OTHER PUBLICATIONS

C.H. Lee, Y.M. Wong, C. Doherty, K.L. Tai, E. Lane, D.D. Bacon, F. Balocchi and A. Katz, "Study of Ni as a barrier metal in AuSn soldering application for laser chip/submount assembly", J. Appl. Phys. 72 (8), Oct. 15, 1992, pp. 3808-3815.

(Continued)

*Primary Examiner*—Minsun Oh Harvey
*Assistant Examiner*—Phillip Nguyen
(74) *Attorney, Agent, or Firm*—Reed Smith LLP; Stanley P. Fisher, Esq.; Juan Carlos A. Marquez, Esq.

(57) ABSTRACT

The present invention provides a highly reliable ridge-waveguide semiconductor laser diode and an optical module. The p-side electrode of the ridge-waveguide laser diode has a first conductor layer region and a second conductor layer region formed on the first conductor layer region. At least one of facets of the second conductor layer region is recessed inward from a reflection facet. Thus, the ridge-waveguide semiconductor laser diode has a structure in which strain which is caused by the electrode stress to be applied on the diode facet is reduced and the saturable absorption does not occur. The ridge-waveguide semiconductor laser diode thus obtained is highly reliable, and the optical module using the same is remarkably high in reliability.

13 Claims, 9 Drawing Sheets

U.S. PATENT DOCUMENTS

| | | |
|---|---|---|
| 6,731,663 B1 | 5/2004 | Kasukawa et al. |
| 6,741,630 B2 | 5/2004 | Takiguchi |
| 6,744,797 B2 * | 6/2004 | Kuniyasu et al. ...... 372/45.011 |
| 6,765,944 B2 | 7/2004 | Yagi et al. |
| 6,773,948 B2 * | 8/2004 | Nakamura et al. ............ 438/46 |
| 6,850,547 B2 * | 2/2005 | Goto ........................ 372/43.01 |
| 2002/0046693 A1 | 4/2002 | Kiyoku et al. |
| 2002/0061044 A1 | 5/2002 | Kuniyasu et al. |

FOREIGN PATENT DOCUMENTS

| | | |
|---|---|---|
| JP | 10-027939 | 7/1996 |
| JP | 11-340573 | 5/1998 |
| JP | 2000-277846 | 3/1999 |

OTHER PUBLICATIONS

N. Yoshida, Y. Yamamoto, K. Katoh, H. Minami, T. Kitano, H. Takano, T. Sonoda, S. Takamiya and S. Mitsui, "Low noise AlInAs/InGaAs HEMT using WSi ohmic contact", Electronics Letters, Jun. 9, 1994, vol. 30, No. 12, pp. 1009-1010.

Chung-En Zah, Rajaram Bhat, Bhadresh N. Pathak, F. Favire, Wei Lin, M.C. Wang, Nicholas C. Andreadakis, D.M. Hwang, M.A. Koza, Tien-Pei Lee, Zheng Wang, David Darby, Dale Flanders and J. James Hsieh, "High-Performance Uncooled 1.3-$\mu$m $Al_xGaIn_{1-x-y}$", IEEE Journal of Quantum Electronics, vol. 30, No. 2, Feb. 1994, pp. 511-523.

I. Mito, M. Kitamura, Ke. Kobayashi, Ko. Kobayashi, "Double-Channel Planar Buried-Heterostructure Laser Diode with Effective Current Confinement", Electronics Letters, Oct. 28, 1982, vol. 18, No. 22, pp. 953-954.

Unger, P., et al., "Low-Threshold Strained GaInP Quantum-Well Ridge Lasers with AlGaAs Cladding Layers", 13$^{th}$ IEEE International Semiconductor Laser Conference, 1992, PP 188-189.

* cited by examiner

SEMICONDUCTOR LASER DIODE AND OPTICAL MODULE

This application is a Continuation of nonprovisional application serial No. 10/229,060 filed on Aug. 28, 2002 abandoned, which is hereby incorporated by reference in its entirety. Priority is claimed based on U.S. application Ser. No. 10/229,060 filed on Aug. 28, 2002, which claims the priority of Japanese Application No. 2002-055852, filed on Mar. 1, 2002.

BACKGROUND OF THE INVENTION

The present invention relates to a semiconductor laser diode and an optical module on which the semiconductor laser diode is mounted. Examples of the optical module include an optical transmitter, an optical transceiver and so forth.

Conventionally, an InGaAsP-based material which is lattice matched on an InP substrate has been used for a 1.3 $\mu$m–1.55 $\mu$m-band semiconductor laser diode which is used as a light source in the optical communication. Such semiconductor laser diode has been mounted on an optical transmission module together with a thermoelectric cooler in the prior art. One of the conventional semiconductor laser diodes will be described by way of example. FIG. 13 shows a ridge-waveguide semiconductor laser diode having an electrode structure which extends to a reflection face of a laser cavity. In this example, an n-type InP cladding layer 41, an InGaAsP active layer 42 and a p-type InP cladding layer 5 are deposited on an n-type. InP substrate 1. A p-type InGaAs contact layer 6 is formed on an upper face of the P-InP cladding layer 5 which is formed in the shape of a projection for an emission region. A p-side electrode 8, which is an ohmic electrode, is formed on the p-type InGaAs contact layer 6. In general, the p-side electrode 8 comprises a plurality of conductor layers. A bonding pad 11 is formed on the p-side electrode 8, in a manner extending from the p-side electrode 8. An n-side electrode 10 is provided on a backside of the n-type InP substrate 1.

In turn, an InGaAlAs-based semiconductor laser diode, which operates in a wider temperature range to replace the InGaAsP based ones, is reported by C. E. Zah et al. in "IEEE Journal of Quantum Electronics, Vol. 30, No. 2, P. 511 (1994)". The InGaAlAs-based semiconductor laser diode does not require the thermoelectric cooler during operation at high temperatures. Since a lower cost is desired for the short range Datacom network, developments in a direct modulation type InGaAlAs-based semiconductor laser diode and an optical transmission module including the laser diode is in progress.

Further, in known structures of a semiconductor laser diode using nitride semiconductor material and a buried heterostructure semiconductor laser diode, an electrode metal layer facet in the vicinity of the reflection face is recessed to avoid troubles in the diode fabrication process. For example, Japanese Patent Laid-open No. 2000-277846 discloses a structure of the semiconductor laser diode using nitride semiconductor material wherein a p-side electrode is formed on a contact portion as being extended to a facet of a cavity and a main p-side electrode having its facet at a portion recessed inward from the cavity facet is formed on the p-side electrode. However, since the substrate does not have cleavage properties, the effect of the structure is nothing but a prevention of peeling of the electrodes due to impact accompanying cleavage which occurs at the time of forming the cavity facets and sagging of the main p-side electrode toward the cavity facet. Japanese Patent Laid-open No. 11-340573 discloses a structure wherein no electrode is provided in the vicinity of a reflection face for the purpose of self-sustained pulsation of the gallium nitride-based laser diode, while Japanese Patent Laid-open No. 10-27939 discloses a similar structure for the purpose of preventing electrodes from peeling off due to impact caused by separation at the time of forming cavity facets of a nitride semiconductor laser diode.

Further, Japanese Patent Laid-open No. 3-206678 discloses the conventional buried heterostructure semiconductor laser diode as shown in FIG. 14; however, an effect achieved by a shape of an electrode on a facet is not defined therein. In FIG. 14, reference numeral 1 denotes an n-type InP substrate, 7 denotes a passivation film, 8 denotes a p-side electrode, 9 denotes a first conductor layer of p-side electrode, 10 denotes an n-side electrode, 41 denotes an n-type InP cladding layer, 42 denotes an InGaAsP active region, 43 denotes a lasing region, 44 denotes a p-type InP cladding layer, 45 denotes a p-type InP buried layer, 46 denotes an i-type InP buried layer, 47 denotes an n-type InP buried layer, 48 denotes a p-type InP buried layer, 49 denotes a p-type InGaAsP buried layer, 50 denotes a mesa channel and 51 denotes a buried mesa.

SUMMARY OF THE INVENTION

An object of the present invention is to provide a highly reliable ridge-waveguide semiconductor laser diode and an optical module using the same.

The inventors of the present invention have found that, if the above-described structure shown in FIG. 13 is applied to a ridge-waveguide semiconductor laser diode which is fabricated by using the newly introduced materials such as an InGaAlAs-based material or an InGaAsP-based material, reliability of characteristics of such ridge-waveguide semiconductor laser diode is deteriorated. The deterioration is due to a sudden degradation in emission properties during operation or heavy current injection.

In view of the above-mentioned situation, a primary object of the present invention is to provide a highly reliable ridge-waveguide semiconductor laser diode. Further, another object of the present invention is to provide a highly reliable optical transmission module using the semiconductor laser diode of the present invention.

Technical aspects for achievement of the above objects are as follows. A first technical aspect is a reduction in strain which is caused by an electrode stress applied to a facet of a ridge-waveguide semiconductor laser diode. A second technical aspect is a structure capable of preventing saturable absorption.

A so-called upper electrode of a ridge-waveguide laser diode, which is an ohmic electrode, is formed on a contact layer of a semiconductor layered body for semiconductor laser. In the present invention, the following characteristics are added to the ohmic electrode. More specifically, the upper electrode, i.e., an electrode on the semiconductor layered body is so formed that the electrode has a facet of its electrode layer at a position recessed inward from at least one of reflection facets constituting a cavity of the semiconductor laser. Alternatively, the electrode has an edge portion which is reduced in thickness, and an edge portion of the electrode which is continuous with and thicker than the thinner edge portion is located at a position recessed inward from at least one of the reflection facets constituting the cavity of the semiconductor laser.

In general, the ohmic electrode comprises a plurality of conductor layers. Hereinafter, the present invention will be described using an example of the electrode comprised of a plurality of conductor layers. For brevity, a layer region of the upper electrode at the side of the semiconductor layered body will be referred to as a first conductor layer region and a layer region formed on the first conductor layer region is referred to as a second conductor layer region. A representative mode of the present invention is such that at least one of facets of the second conductor layer region, which is formed on the first conductor layer region, is located at a position recessed inward from a facet of the first conductor layer region. Thus, it is possible to reduce a thickness of the conductor layers for the electrode in the vicinity of a reflection facet of an optical cavity or to recess the conductor layers for the electrode inward from the vicinity of the reflection facet of the optical cavity.

The ridge-waveguide is a type of a semiconductor laser diode wherein a semiconductor layered body in the shape of a projection having a width substantially corresponding to an emission region and a length in a light-propagating direction is provided on a portion upper from an active region of the semiconductor laser diode with respect to a semiconductor substrate. In general, the semiconductor laser diode which is provided with the projected semiconductor layered body having a width corresponding to an emission region is called the ridge-waveguide laser. In many cases, a semiconductor layered body which is upper part of a cladding layer formed on an active region is formed as the projected semiconductor layered body as described above. Of course, it is possible to vary the structure of the projected semiconductor layered body when so required.

There are variations of the mode of locating at least one of the facets of the second conductor layer region at a position recessed inward from the facet of the first conductor layer region. Of course, the effect of the present invention is achieved by locating one of the facets in the above-described manner; however, it is preferred to apply the mode to both of the facets of the optical cavity. The reason therefor will be understood in terms of factors of the effect.

The following modes are representative of the mode of locating at least one of the facets of the second conductor layer region at a position recessed inward from the facet of the first conductor layer region.

(1) The facet of the first conductor layer region and the facet of the optical cavity are located at substantially identical positions, and the facet of the second conductor layer region is recessed inward from the first conductor layer region.

(2) Both of the facets of the first and the second conductor layer region are recessed inward from the facet of the optical cavity.

(3) Both of the facets of the first and the second conductor layer region are recessed inward from the facet of the optical cavity, and the facet of the second conductor layer region is recessed inward from the first conductor layer region.

(4) The names "first conductor layer region" and "second conductor layer region" are used for brevity in the above description; however, if the first conductor layer region comprises a plurality of conductor layers, it is possible to recess a part of the layers inward from the facet of the optical cavity and to locate the second conductor layer region, the first conductor layer region and the facet of the optical cavity at substantially identical positions. Owing to the partially recessed conductor layer, it is possible to reduce the thickness of the electrode in the vicinity of the facet of the optical cavity. Alternatively, the same effect can be achieved by reducing a thickness in the vicinity of a relevant edge portion of a layer in place of removing the vicinity of an edge of the part of the layers. In addition, it is practical to perform such layer processing on the uppermost layer of the conductor layers. The use of a gold layer for an uppermost layer is considerably effective.

(5) In general, layers other than the contact layer, with which at least the first conductor layer region contacts, are covered with an insulator film. It is possible to cover the vicinity of at least one of facets of the contact layer with the insulator film and to form the first conductor layer region of the electrode on the contact layer so as to cover at least a part of the insulator film with the facet thereof being located at a position substantially identical with the facet of the optical cavity or at a position recessed inward from the optical cavity facet.

In addition, the above structures of the electrode in the vicinity of one of the facets may be used in combination for opposite facets.

Thus, remarkably high reliability is achieved by mounting any one of the ridge-waveguide semiconductor laser diodes of the present invention on an optical module.

DESCRIPTION OF THE PREFERRED EMBODIMENTS

Figure 1:
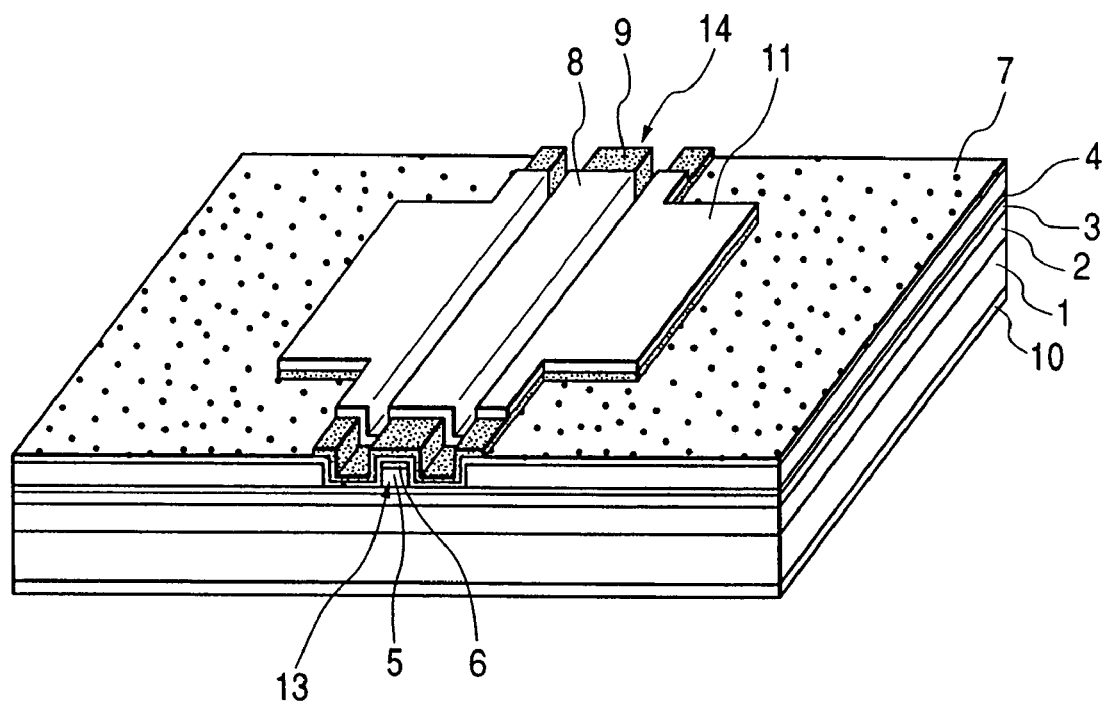
FIG. 1 is a perspective view showing a semiconductor laser diode according to a first embodiment of the present invention.

Basic aspects (general technical aspects) of the present invention will be described, followed by descriptions of respective modes of embodiments of the present invention.

To be brief, an upper electrode is firstly formed on a contact layer and then an electrode in the vicinity of a facet is reduced in thickness in the present invention. Therefore, if a substrate is an n-type semiconductor substrate, the p-side electrode on the contact layer is formed by depositing titanium, platinum and gold in this order, and a thickness of gold on the diode facet is reduced while the thicknesses of titanium and platinum, which are barrier metals, are left as they are. In order to diminish the stress to be caused by the whole electrodes, the thicknesses of titanium and platinum, which serve as an ohmic electrode, may be reduced within the extent to which effects of the barrier metals are achieved.

More specifically, each of the side faces of the ridge-waveguide is covered with an insulator film, and the electrode comprises the ohmic electrode which is formed on the contact layer to cover the outside of the insulator film on the side faces of the ridge and the electrode metal which is formed to cover the ohmic electrode with at least one of its facets being located at a position recessed inward from the ohmic electrode facet. It is practical that the ohmic electrode includes titanium and platinum layers in this order on the contact layer and that an uppermost layer of the electrode metal is formed of gold. Also, it is preferable that the ohmic electrode includes titanium and nickel layers in this order on the contact layer and that-the uppermost layer of the electrode metal is formed of gold or tungsten silicide.

In a representative method of fabricating the electrode, for example, materials respectively containing titanium and platinum for forming the ohmic electrode and gold for forming the uppermost layer of the electrode metal are deposited continuously, and then part or whole of the thickness of the gold layer is reduced or eliminated such that a facet of the gold layer is located at a position recessed inward from a facet of the ohmic electrode.

In this case, a resistance of the thus obtained ohmic electrode is increased to thereby reduce current diffusion in a direction vertical to the thickness of the cladding layer even if InP, which tends to cause the current diffusion of the ridge, is used for the ridge. Therefore, the current is prevented from flowing to the facets to thereby cause saturable absorption in some cases. For example, in the case where a height of the ridge is 1.7 $\mu$m and the removed thickness of the uppermost layer of the electrode metal is 50 $\mu$m, the saturable absorption occurs if a sheet resistance of the ohmic electrode is 60 $\Omega$, but not if the sheet resistance of the ohmic electrode is 40 $\Omega$. Also, the saturable absorption does not occur if the removed thickness of the uppermost layer of the electrode metal is 25 $\mu$m even when the sheet resistance of the ohmic electrode is 60 $\Omega$. Practical values should be set in view of the characteristics such as the current diffusion and saturable absorption as described above.

It is also possible to recess the electrode facet from the diode facet to such an extent that the recession does not cause the saturable absorption. In this case, an insulator film is firstly attached on an upper face of the contact layer at a portion close to the diode facet to form the p-side electrode on the insulator film, and a degree of the recession of the electrode facet from the diode facet can sufficiently be defined depending on the insulator film. Here, the p-side electrode facet or the upper electrode is recessed inward from the diode facet to reduce a stress applied on the diode facet. For example, in the case where the p-side electrode facet is recessed inward from the diode facet, the saturable absorption occurs if the height of the ridge is 1.7 $\mu$m and the insulator film on the contact layer upper face is recessed inward from the facet by 10 $\mu$m, but not if the recession is 7 $\mu$m or less. Thus, if the insulator film is recessed inward from the facet by 7 $\mu$m, the recession of the p-side electrode facet may be from about 2 $\mu$m to about 6 $\mu$m, for example.

Since it is necessary to secure an area for conduction, the range of elimination of the upper electrode metal may preferably be small as possible.

In the junction-down mounting process, the upper electrode metal is degraded in heat dissipation in the case of insufficient solder wetting. Therefore, an area for the solder wetting must be secured. On the other hand, a facet of the upper electrode metal is recessed inward from the diode facet by about 2 $\mu$m, for example, in order to prevent the solder stress in fusing the semiconductor laser diode and a heat sink from affecting the diode facet.

Specific values of the elimination of the electrode at the facet are decided depending on factors such as the resistance and cleavage of the ohmic electrode. Under the above-described conditions, it is preferable that the product of the distance from the ohmic electrode facet to the electrode metal facet and the sheet resistance of the ohmic electrode is 2 $\Omega$·mm or less. As mentioned above, the saturable absorption does not occur when the distance from the ohmic electrode facet to the electrode metal facet is 50 $\mu$m (i.e. 0.05 mm) and the sheet resistance of the ohmic electrode is 40 $\Omega$. In this case, the product of the distance and the sheet resistance is 2 $\Omega$·mm. Also, the saturable absorption does not occur when the distance from the ohmic electrode facet to the electrode metal facet is 25 $\mu$m (i.e. 0.025 mm) and the sheet resistance of the ohmic electrode is 60 $\Omega$. In this case, the product of the distance and the sheet resistance is 1.5 $\Omega$·mm. In turn, the saturable absorption occurs when the distance is 50 $\mu$m (i.e. 0.05 mm) and the sheet resistance in the ohmic electrode is 60 $\Omega$ as mentioned above. In this case, the product of the distance and the sheet resistance is 3 $\Omega$·mm. As a result of the study conducted under the above-described conditions, the saturable absorption does not occur if the product of the distance from the ohmic electrode facet to the electrode metal facet and the sheet resistance in the ohmic electrode is 2 $\Omega$·mm or less.

The insulator film is provided on the projected semiconductor layered body constituting the ridge-waveguide of the semiconductor laser diode except for the region on which the conductor layer for electrode is provided. In practice, an electrode pad portion which extends from the conductor layer for electrode is formed.

<Comparison Between Experiments Based on the Conventional Structure and the Present Invention>

Figure 13:
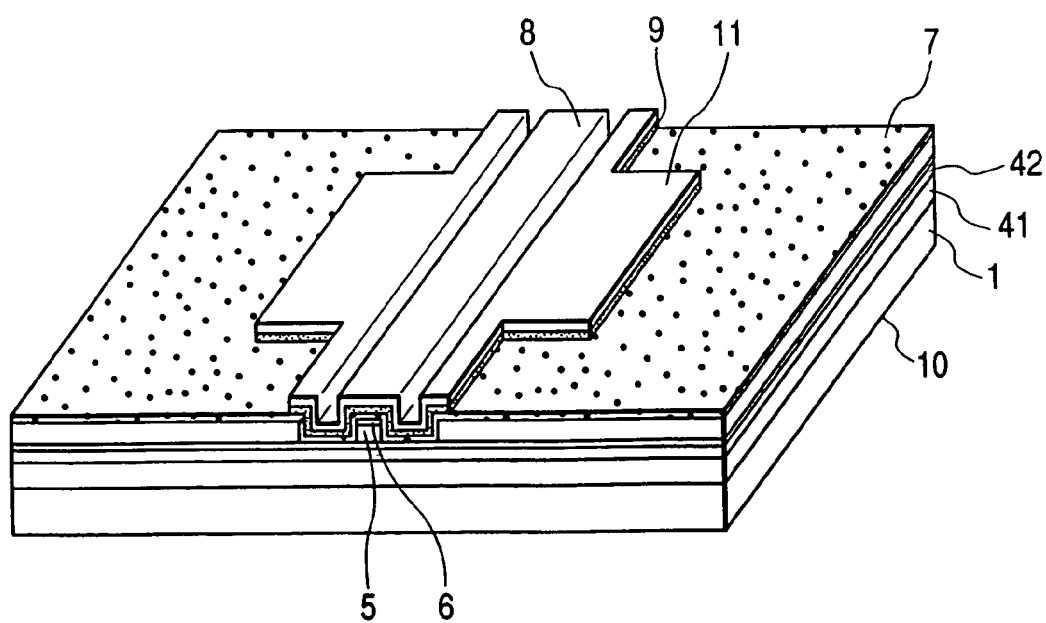
FIG. 13 is a perspective view showing a conventional semiconductor laser diode provided with an electrode which extends to reflection facets.
Figure 14:
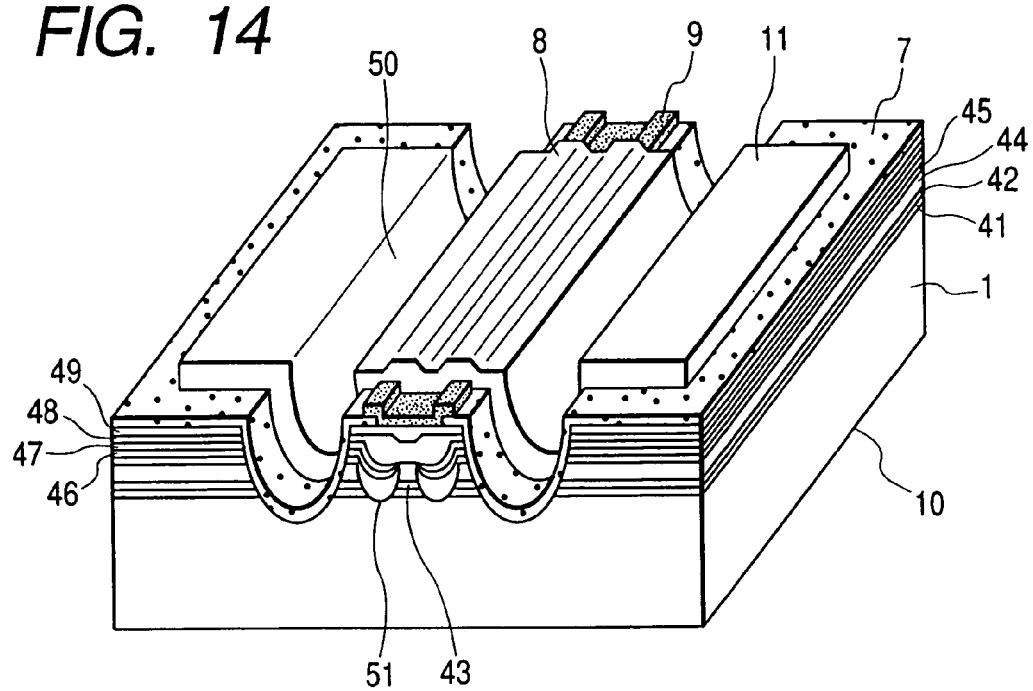
FIG. 14 is a perspective view showing a conventional buried heterostructure semiconductor laser diode wherein an electrode metal is recessed inward in the vicinity of reflection facets.

Causes for deterioration in characteristics of a semiconductor laser diode during ordinary operations are estimated as follows. In a ridge-waveguide semiconductor laser diode, strain caused by a stress of an electrode near an active region affects a ridge joint portion due to a form with a level difference on a surface near the active region. A thermal expansion coefficient of metals used for the electrode is twice that of a semiconductor substrate. This is because a tensile stress remains during heating and then cooling the whole semiconductor laser diode in mounting the semiconductor laser diode. In the structure where the electrode is extended to the reflection facet as shown in FIG. 13, the stress applied on the ridge joint portion is so heavy that the ridge portion tends to be bent.

Figure 2:
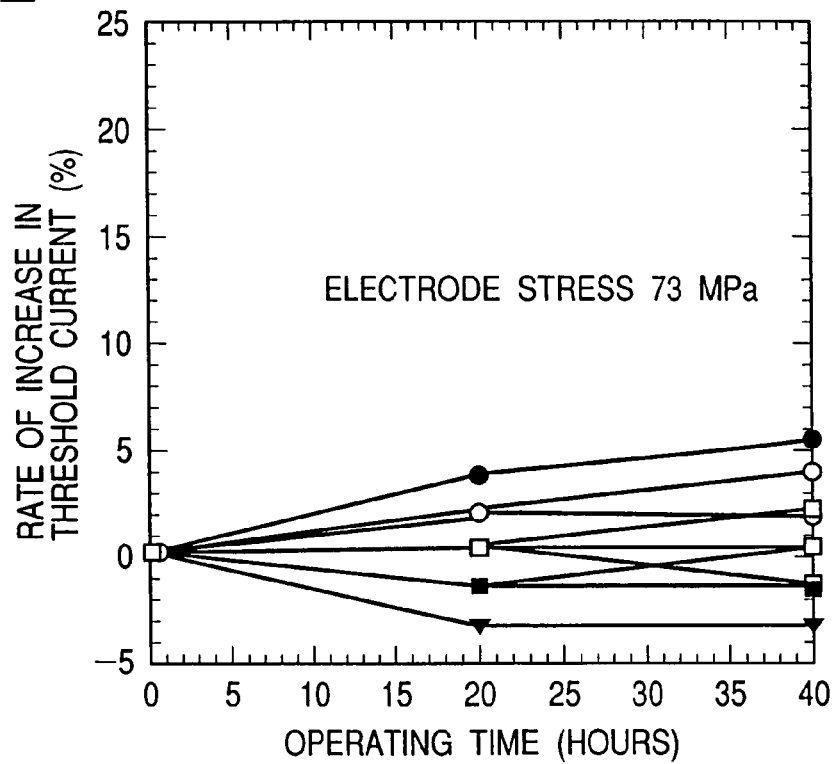
FIG. 2 is a graph showing an example of a relationship between an upper electrode stress of the semiconductor laser diode and a rate of increase in threshold current after starting operation.
Figure 3:
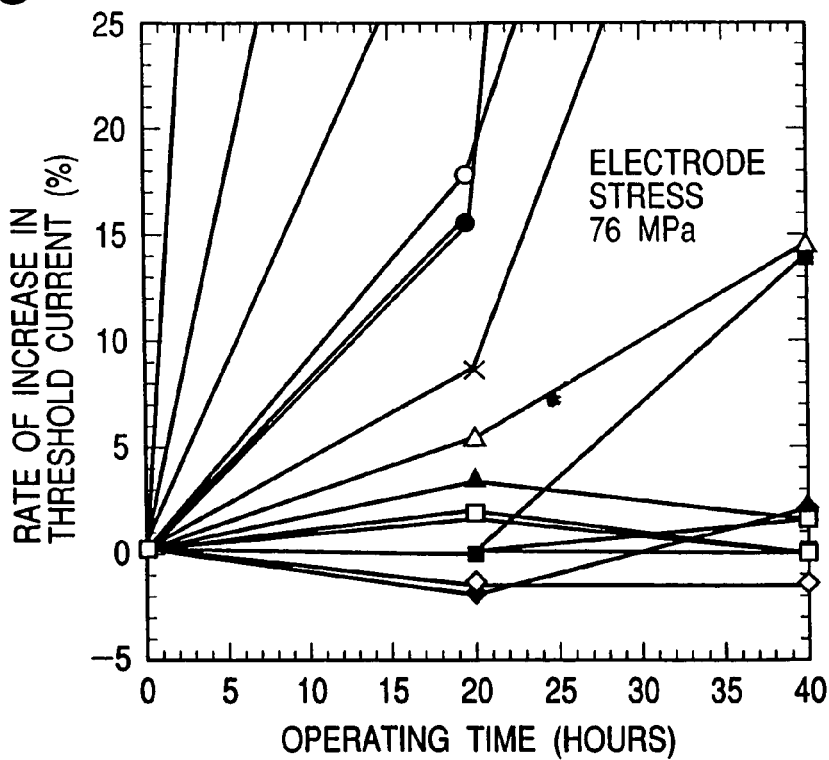
FIG. 3 is a graph showing an example of a relationship between an upper electrode stress of the semiconductor laser diode and a rate of increase in threshold current after starting operation.

Further, as is apparent from the characteristics shown in FIGS. 2 and 3, the stress influences largely on the reliability of the semiconductor laser diode. FIG. 2 shows characteristics of a diode when an electrode stress is 73 MPa, and FIG. 3 shows characteristics of a diode when an electrode stress is 76 MPa. Each of the graphs of FIGS. 2 and 3 shows a rate of increase in threshold current with respect to operating time when the semiconductor laser diode is driven at a constant current. In either cases, the operating current was $4.3 \times 10^8$ A/m$^2$, and the diode was operated in a nitrogen atmosphere of 100° C. The graphs are for the comparison of characteristics of diodes fabricated under the same conditions; however, quite a few variations in the rate of increase in threshold current are observed in FIG. 3, wherein the electrode stress is larger and such electrode stress leads to a generation of a large amount of diodes which are deteriorated in characteristics. In turn, the rate of increase in threshold current and the deterioration in characteristics are smaller in FIG. 2 in which the electrode stress is smaller.

In addition, in each of the diodes used for the above measurements, the stress was changed by changing the thickness of the electrode near the active region. As shown in FIG. 3, the threshold current rapidly increased during the ordinary operation to deteriorate the semiconductor laser diode when the electrode stress is large. The above results are sufficient for estimating that the laser diode having a low electrode stress is highly reliable, while the stress of the electrode near the active region causes the strain and the strain affecting the active region and the ridge-waveguide leads the laser diode to the degradation.

Figure 4:
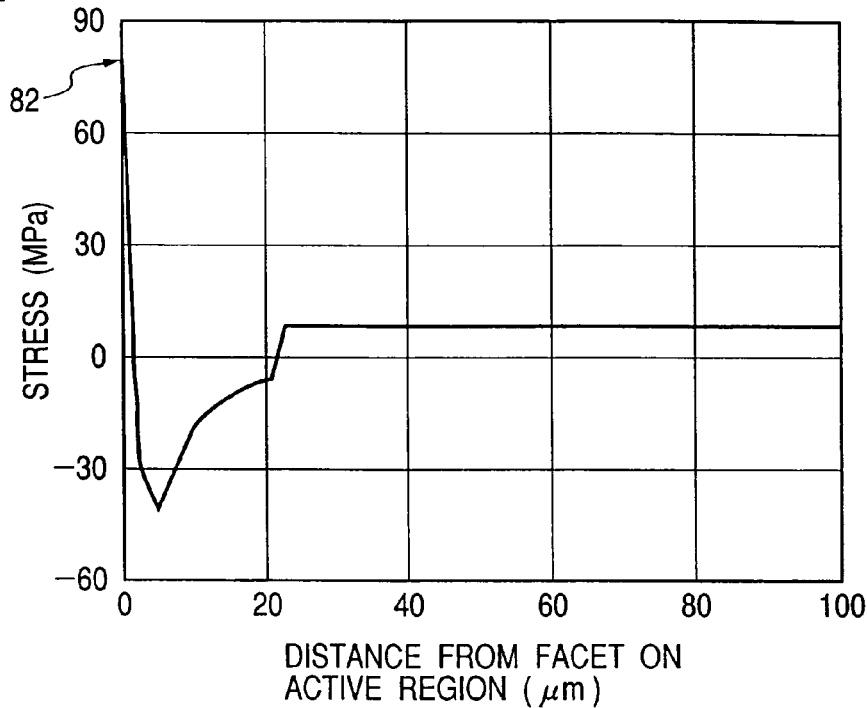
FIG. 4 is a graph showing an example of calculation results of a stress applied on an active region by the upper electrode of a ridge-waveguide semiconductor laser diode of the conventional structure.

FIG. 4 is a graph showing results of calculation of a stress applied to an active region of a ridge-waveguide semiconductor laser diode, the stress being caused by an electrode near the active region. The horizontal axis is a distance from a reflection facet on the active region to a position at the interior of an optical cavity, and the vertical axis is a stress at the position. As seen from the calculation results of FIG. 4, the tensile stress caused by a metal film which is used for the upper electrode on the active region of the ridge-waveguide semiconductor laser is particularly high in the vicinity of the reflection facet. Strain caused by the stress is large on the reflection facet on the active region. Therefore, dislocation occurs on the active region, which is apt to be increased. The rate of degradation of semiconductor laser diode will be increased due to such dislocation and its propagation. At a portion of the active region at which the tensile strain occurs, a band gap of the semiconductor is smaller than that of other portions. Therefore, temperature rise is caused by light absorption at the time of semiconductor lasing, which leads to a further reduction in the band gap to cause the light absorption. Due to such positive feedback, the laser diode ultimately causes a light power failure in some cases. An experiment was conducted by driving the conventional semiconductor laser diode shown in FIG. 13 under an automatic power control for light power of 10 mW in a nitrogen atmosphere of 85° C. As a result, the light power of 10 mW was not maintained due to deterioration in differential quantum efficiency.

Figure 5:
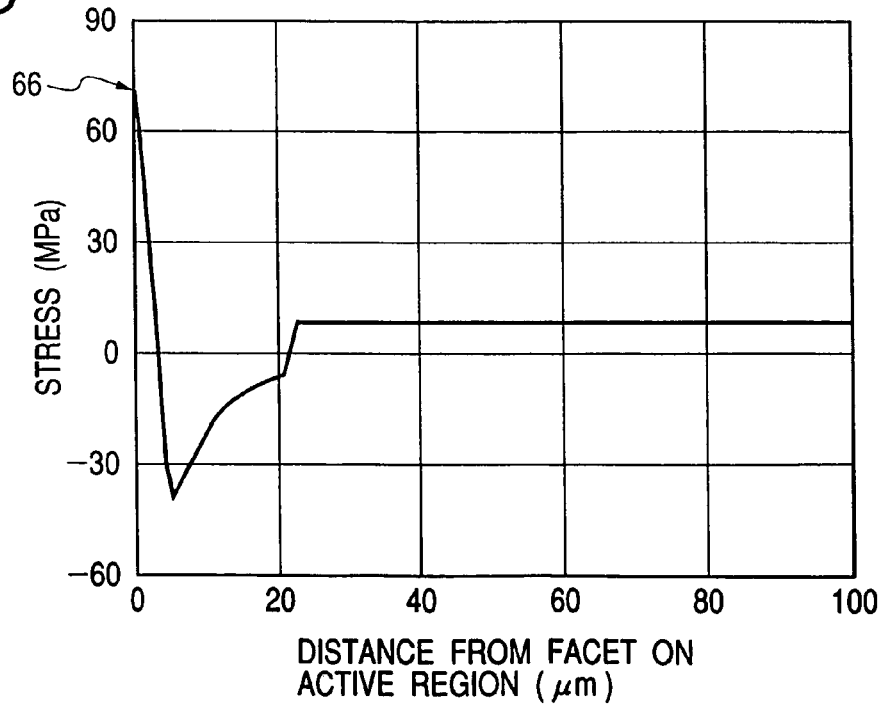
FIG. 5 is a graph showing an example of calculation results of a stress applied on an active region by the upper electrode of the ridge-waveguide semiconductor laser diode of the present invention.

FIG. 5 is a graph showing results of calculation of a stress in the active region which is caused by the upper electrode in the above-described embodiment of the present invention. In the structure of the laser diode, a portion of about 2 μm of the metal on the upper face of the ridge of the ridge-waveguide laser diode was eliminated. The horizontal axis of the graph is a distance from a reflection facet on the active region to a position at the interior of an optical cavity, and the vertical axis is a stress at the position. As seen from the calculation results of FIG. 5, the tensile stress caused by a metal film which is used for the p-side electrode on the active region of the ridge-waveguide semiconductor laser is reduced by 20% when the portion of about 2 μm of the metal at the upper face of the ridge was eliminated as compared with the case wherein gold is deposited on the whole of the ridge upper face. In this example, only the ridge upper face is subjected to the elimination of gold; however, a lower stress can be achieved by eliminating gold deposited on both side faces of the ridge.

In turn, causes of the degradation due to the heavy current injection are estimated as follows. Current-light power characteristics of two structures were compared with stress caused by an electrode in the vicinity of a reflection facet being kept at a substantially equal level. A sudden deterioration occurred when a heavy current of 2500 A/mm$^2$ was injected to the ridge-waveguide semiconductor laser diode having the structure shown in FIG. 13. In turn, in a modified structure of the one shown in FIG. 13, wherein an ohmic electrode 9 and a p-side electrode 8 were attached on a p-type InAlAs contact layer 6 which is covered with a silicon oxide insulator film up to a portion of 5 μm from the edge, light power was saturated when the heavy current of 2500 A/mm$^2$ was injected to a ridge-waveguide semiconductor laser diode without the degradation. In the latter diode, the current was not injected in the vicinity of the reflection facet, and carriers are supplied to the facet region by the current diffusion in the p-type InP cladding layer. That is to say, the sudden degradation hardly occurs in a diode having a low current density if the current density is uniform in the central area of the diode, and thus such diode is highly reliable. Thus, it is estimated that, if the current density is large in the vicinity of the reflection facet, heat is generated due to a nonradiative recombination through an interfacial state between the native oxide and the facet coating film on the active region facet, and such heat leads to the degradation.

Since the tensile strain occurs in a region which is distant by about 2 μm from the reflection facet on the active region as can be seen from the calculation results of FIG. 4, it is also necessary to reduce the light absorption by reducing the current density in the region to be smaller than that of other regions in order to prevent the carrier from being used for the nonradiative recombination. For that purpose, the current density in the vicinity of the active region in the reflection facet must be made smaller than that in the cavity. However, if the current density on the reflection facet on the active region is too low for the current to flow to the facet, the saturable absorption occurs to cause the degradation of diode. Therefore, in order to reduce the light absorption, it is necessary either to reduce the thickness of the electrode on the facet to such a degree as not to cause the saturable absorption or to reduce the area of the electrode.

The calculation of FIG. 4 does not allow for the strain on the semiconductor layer since the semiconductor layer is assumed to be made of InP; however, if compressive strain occurs on the active region, the tensile strain occurs on the reflection facet due to release of the strain. Therefore, it can be estimated that the actual strain may be larger as being added up with the strain of the electrode metal film.

The above description is for the comparison and examination of characteristics based on the basic aspects of the present invention. Hereinafter, specific modes of embodiment of the present invention will be described.

First Embodiment

A conductor layered body constituting a p-side electrode, i.e., an upper conductor layer of a first conductor layer region and a second conductor layer region, more specifically, an area in the vicinity of a reflection facet on the second conductor layer region, is removed in this embodiment. Thus, a part of an electrode near an active region is recessed inward from the reflection facet.

FIG. 1 is a perspective view showing a semiconductor laser diode of the present embodiment. On an n-type InP substrate 1, a layered body of a compound semiconductor having a typical double heterostructure is formed by the metal organic vapor phase epitaxy. More specifically, an n-type InAlAs cladding layer 2, an InGaAlAs SCH (Separate Confinement Heterostructure) layer (not shown since this is an additional layer), an InGaAlAs active region 3, an InGaAlAs SCH layer (not shown since this is an additional layer), a p-type InAlAs first cladding layer 4, a p-type InP second cladding layer 5 and a p-type InGaAs contact layer 6 are formed in this order. Here, the SCH layer is a type of layer for separating a carrier confinement region from an optical confinement region, which is known.

The p-type InP second cladding layer 5 and the p-type InGaAs contact layer 6 are formed by the photolithography so as to provide a ridge-waveguide structure.

A silicon oxide film 7 is formed on a region other than a surface of the p-type InGaAs contact layer 6 which is a ridge-waveguide region as a passivation film by the plasma CVD (Chemical Vapor Deposition).

As a p-side electrode 8 for constituting an ohmic electrode, a first and second conductor layer regions 9-1 and 9-2 of the p-side electrode are formed on the silicon oxide film 7. More specifically, a titanium layer having a thickness of 100 nm, a platinum layer having a thickness of 100 nm and a gold layer having a thickness of 600 nm are deposited in this order on the silicon oxide film 7 by vapor deposition. Then, the conductor layers of the first and second conductor layer regions 9-1 and 9-2 are processed to leave an upper face of the ridge and a bonding pad 11.

A portion of the gold layer which is an uppermost layer among the layers forming the electrode in the vicinity of the reflection facet is removed by the photolithography. The titanium layer, platinum layer and part of the gold layer are remained as they are. The titanium layer and platinum layer constitute the first conductor layer region 9-1, and the gold layer is the second conductor layer region 9-2. The portion to be removed of the gold layer in the vicinity of the reflection facet may be small as possible. For example, the removed portion may be 10 µm. Preferable example of an etching solution to be used may be one prepared by dissolving ammonium iodine (NH$_4$I) and iodine (I$_2$) in pure water.

After thinning a bottom face of the n-type InP substrate 1 by grinding to achieve a thickness of 120 µm, an n-side electrode 10 is formed by depositing gold-germanium, nickel and gold on the bottom face by vapor deposition. Then, the thus obtained semiconductor laser wafer is cleaved to form a pair of laser cavity facets 13 and 14. An ordinary insulator film is formed on each of the cavity facets for the purpose of protection thereof and adjustment of reflectance. The insulator film is not shown in FIG. 1.

Figure 6:
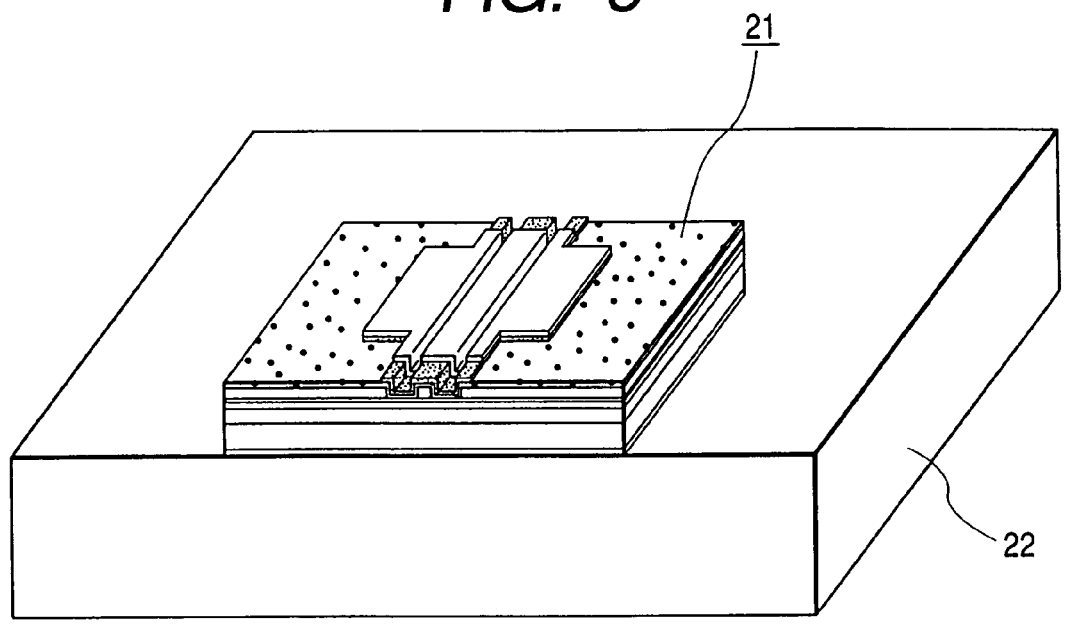
FIG. 6 is a diagram showing a mounting method of the semiconductor laser diode according to the first embodiment of the present invention.

As shown in FIG. 6, the thus obtained semiconductor laser diode 21 is connected to a silicon submount 22 by the junction-up method using a gold-tin based soldering material, and a diode electrode and a package electrode lead are connected to each other using a gold wire (not shown). The junction-up method is a type of mounting method for placing an active region on an upper position with respect to the submount 22.

The semiconductor laser diode of the present invention operates stably for 5,000 hours in a nitrogen atmosphere of 85° C. under a constant driving condition of 10 mW of light power. Estimated life of the diode of the present embodiment is 100,000 hours. Further, in the present embodiment, it is possible to deposit the p-side electrode 8 and the ohmic electrode 9 continuously in one process step. Therefore, a diode resistance can readily be regulated to a value which is substantially the same as that of the conventional diode. Thus, the fabrication process of the present embodiment is advantageously simple.

Second Embodiment

In the present embodiment, an edge of a p-side electrode at the side of an emission face is recessed inward from a reflection facet. Further, the first conductor layer region which constitutes the p-electrode is left as it is, while a reflection facet side of a second conductor layer region which is formed on a first conductor layer region is recessed more inward from a reflection facet side of the first conductor layer region.

Figure 7:
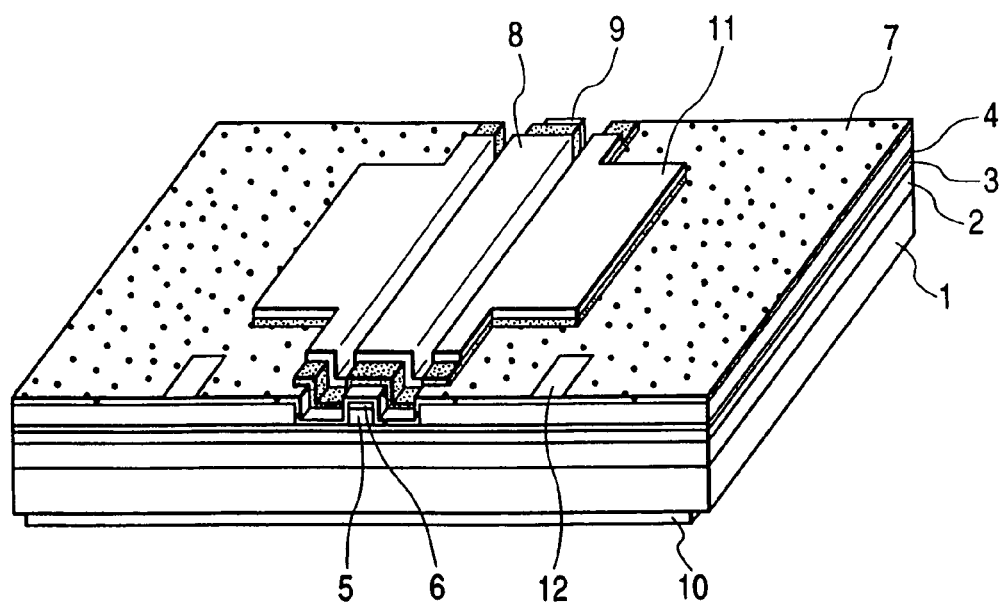
FIG. 7 is a perspective view showing a semiconductor laser diode according to a second embodiment of the present invention.

FIG. 7 is a perspective view showing a semiconductor laser diode according to the present embodiment. On an n-type InP substrate 1, an n-type InAlAs cladding layer 2, an InGaAlAs SCH (Separate Confinement Heterostructure) layer (not shown), an InGaAlAs active region 3, an InGaAlAs SCH layer (not shown), a p-type InAlAs first cladding layer 4, a p-type InP second cladding layer 5 and a p-type InGaAs contact layer 6 are formed in this order by the metal organic vapor phase epitaxy. Then, in the same manner as in the foregoing embodiment, the p-type InP second cladding layer 5 and the p-type InGaAs contact layer 6 are processed so as to form a so-called ridge waveguide by the photolithography. Regions other than a surface of the p-type InGaAs contact layer 6 and a portion having a width of 7 µm in the vicinity of a facet of the p-type InGaAs contact layer 6 are covered with a silicon oxide film 7 which is formed by the plasma CVD.

On the silicon oxide film 7, a first conductor layer region 9-1 and a second conductor layer region 9-2 are formed continuously as a p-side electrode 8 by depositing a titanium layer having a thickness of 200 nm, a platinum layer having a thickness of 150 nm and a gold layer having a thickness of 600 nm in this order. Thus, a layered body for an ohmic electrode is formed as the p-side electrode 8.

The layered body except for the portion of 7 $\mu$m at its facet is processed so as to leave an upper face of the ridge and a bonding pad 11. In this case, a portion of the second conductor layer region, which is an uppermost face of the first conductor layer region and the second conductor layer region in the vicinity of the reflection facet, is removed by the photolithography to leave the first conductor layer region and other portion of the second conductor layer region as the ohmic electrode. In this embodiment, the first conductor layer region includes the titanium layer and the platinum layer, and the second conductor layer region is the gold layer. The removed portion on the gold layer in the vicinity of the reflection facet is, for example, 5 $\mu$m from the facet of the first conductor layer. An etching solution to be used is prepared by dissolving ammonium iodide (NH$_4$I) and iodine (I$_2$) in pure water.

Then, after thinning a bottom face of the n-type InP substrate 1 by grinding to achieve a thickness of 120 $\mu$m, an n-side electrode 10 is formed by depositing gold-germanium, nickel, titanium, platinum and gold on the bottom face by vapor deposition.

The thus obtained semiconductor laser wafer is cleaved to form a pair of laser cavity facets. An insulator film is formed on each of the cavity facets for the purpose of protection thereof and adjustment of reflectance. The insulator film is not shown in FIG. 7.

Figure 8:
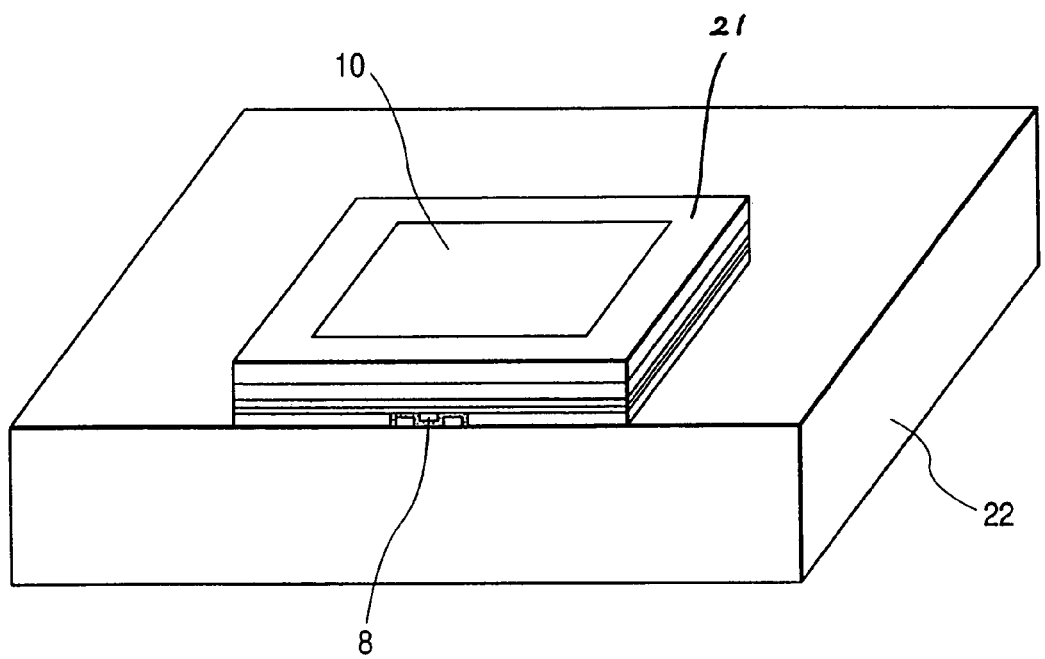
FIG. 8 is a diagram showing a mounting method of the semiconductor laser diode according to the second embodiment of the present invention.

FIG. 8 is a perspective view showing a state in which a semiconductor laser diode 21 is mounted on a submount 22. The semiconductor laser diode 21 is mounted on the silicon submount 22 on which a gold-tin based solder material is patterned in the same manner as that of the p-side electrode 8 of the semiconductor laser diode by the junction-down method. In the mounting, the p-side electrode 8 and the patterned solder are connected by transmitting infrared ray to confirm the positions of positioning markers 12, and a semiconductor laser diode electrode and a package electrode lead are connected using a gold wire (not shown).

The semiconductor laser diode of the present invention operates stably for 5,000 hours in a nitrogen atmosphere of 85° C. under a constant driving condition of 10 mW of light power. Estimated life of the diode of the present embodiment is 100,000 hours.

Third Embodiment

The third embodiment is similar to the first and second embodiments, but different in fabrication process. In this embodiment, a second conductor layer region is formed after forming a first conductor layer region, not continuously.

Figure 9:
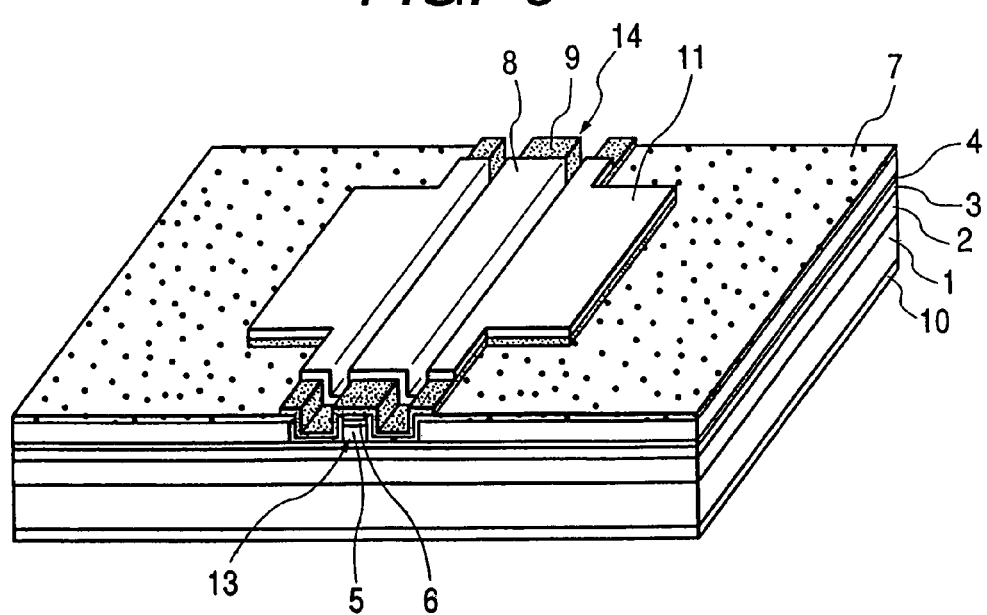
FIG. 9 is a perspective view showing a semiconductor laser diode according to a third embodiment of the present invention.

FIG. 9 is a perspective view showing a semiconductor laser diode according to the present embodiment. In the same manner as in the foregoing embodiments, an n-type InAlAs cladding layer 2, an InGaAlAs SCH (Separate Confinement Heterostructure) layer (not shown), an InGaAlAs active region 3, an InGaAlAs SCH layer (not shown), a p-type InAlAs first cladding layer 4, a p-type InP second cladding layer 5 and a p-type InGaAs contact layer 6 are formed on an n-type InP substrate 1 in this order by the metal organic vapor phase epitaxy. The p-type InP second cladding layer 5 and the p-type InGaAs contact layer 6 are processed so as to form a ridge waveguide by the photolithography. Regions other than a surface of the p-type InGaAs contact layer 6 are covered with a silicon oxide film 7 which is formed by the thermal CVD.

On the silicon oxide film 7, a titanium layer having a thickness of 100 nm, a platinum layer having a thickness of 100 nm and a gold layer having a thickness of 50 nm are deposited in this order by vapor deposition to form a first conductor layer region 9-1 of a p-side electrode 8. Then, the first conductor layer region is processed so as to leave an upper face of the ridge and a bonding pad 11. Regions other than the first conductor layer region 9-1 and a portion of 10 $\mu$m from a reflection facet on the ridge upper face are protected by photoresist. On the photoresist layer, a second conductor layer 9-2 of the p-side electrode is formed by depositing a titanium layer having a thickness of 100 nm and a gold layer having a thickness of 500 nm in this order by vapor deposition. Then, the second conductor layer region 9-2 is processed using the photoresist by the lift-off method. Thus, the second conductor layer which is recessed inward from the reflection facet by 10 $\mu$m is formed.

Then, after thinning a bottom face of the n-type InP substrate 1 by grinding to achieve a thickness of 120 $\mu$m, an n-side electrode 10 is formed by depositing gold-germanium, nickel and gold on the bottom face by vapor deposition. The thus obtained semiconductor laser wafer is cleaved to form a pair of laser cavity facets 13 and 14. An insulator film is formed on each of the cavity facets by an ordinary method for the purpose of protection thereof and adjustment of reflectance. The insulator film is not shown in FIG. 9.

As shown in FIG. 6, the thus obtained semiconductor laser diode 21 is connected to a silicon submount 22 using a gold-tin based solder material by the junction-up method, and a diode electrode and a package electrode lead are connected to each other using a gold wire.

The semiconductor laser diode of the present embodiment operates stably for 5,000 hours in a nitrogen atmosphere of 60° C. under a constant driving condition of 10 mW of light power, and an estimated life of the diode is 200,000 hours.

Fourth Embodiment

The structure of the present embodiment is the same as that of the first embodiment, except for changing a part of materials of the p-side electrode.

A perspective view of the structure according to the present embodiment is the same as that shown in FIG. 1. A crystal structure and a method of forming a ridge of the present embodiment are the same as those of the first embodiment. More specifically, regions other than a surface of a p-type InGaAs contact layer 6 are covered with a silicon oxide film which is formed by the thermal CVD. On the silicon oxide film, an ohmic electrode, i.e., a first conductor layer region 9-1 of a p-side electrode 8 is formed by depositing a titanium layer having a thickness of 100 nm, a nickel layer having a thickness of 300 nm and a gold layer having a thickness of 50 nm in this order by vapor deposition. Then, the first conductor layer region 9-1 is processed so as to leave an upper face of the ridge and a bonding pad 11.

Regions other than the first conductor layer region 9-1 and a portion of 10 $\mu$m from an edge of the ridge upper face are protected by photoresist. On the first conductor layer region 9-1, a second conductor layer region 9-2 is formed by depositing a titanium layer having a thickness of 100 nm and a gold layer having a thickness of 500 nm in this order by vapor deposition. Then, the second conductor layer region 9-2 is processed using the photoresist by the lift-off method. Thus, the second conductor layer which is recessed inward from the reflection facet by 10 $\mu$m is formed.

After thinning a bottom face of an n-type InP substrate 1 by grinding to achieve a thickness of 120 $\mu$m, an n-side electrode 10 is formed by depositing gold-germanium, nickel and gold on the bottom face by vapor deposition. The thus obtained semiconductor laser wafer is cleaved to form a pair of laser cavity facets 13 and 14. An insulator film is formed on each of the cavity facets for the purpose of protection thereof and adjustment of reflectance. The insulator film is not shown in FIG. 1.

As shown in FIG. 8, a semiconductor laser diode 21 is connected, by the junction-down method, to a silicon submount 22 on which a gold-tin based solder material is patterned in the same manner as that of the p-side electrode 8 of the semiconductor laser diode, and a diode electrode and a package electrode lead are connected to each other using a gold wire (not shown).

The semiconductor laser diode of the present invention operates stably for 5,000 hours in a nitrogen atmosphere of 60° C. under a constant driving condition of 10 mW of light power, and an estimated life thereof is 100,000 hours.

Fifth Embodiment

In the present embodiment, a p-side electrode 8 itself, i.e., both of a first and second conductor layer regions of the p-side electrode 8 are recessed inward from an edge of the emission region.

Figure 10:
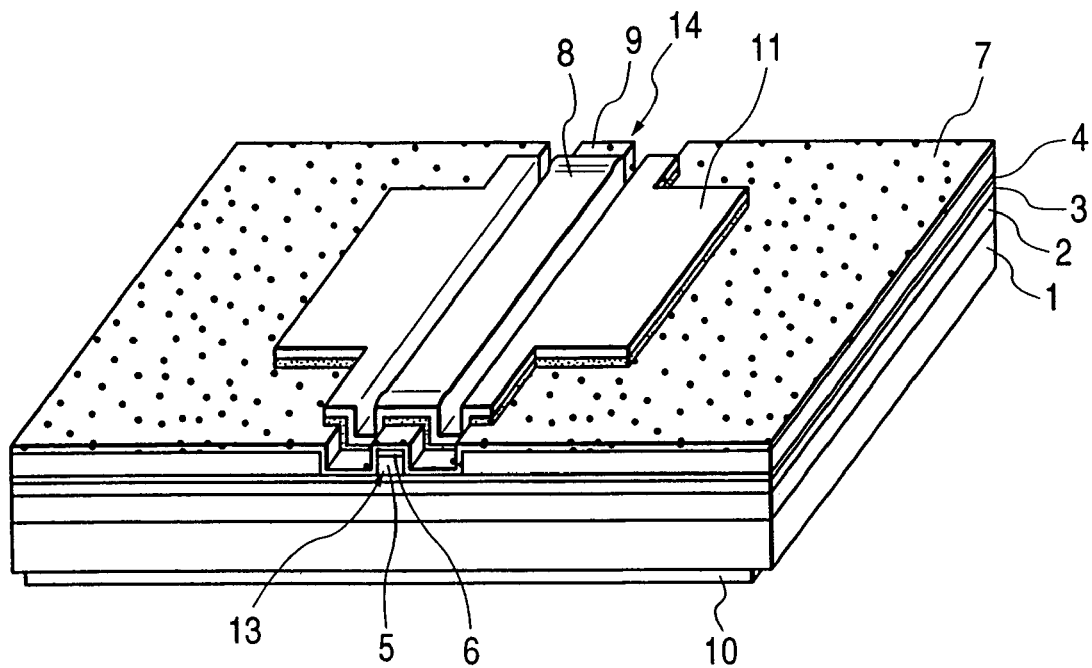
FIG. 10 is a perspective view showing a semiconductor laser diode according to a fifth embodiment of the present invention.

FIG. 10 is a perspective view showing a semiconductor laser diode according to the present embodiment. In the same manner as in the foregoing embodiments, an n-type InAlAs cladding layer 2, an InGaAlAs SCH (Separate. Confinement Heterostructure) layer (not shown), an InGaAlAs active region 3, an InGaAlAs SCH layer (not shown), a p-type InAlAs first cladding layer 4, a p-type InP second cladding layer 5 and a p-type InGaAs contact layer 6 are formed on an n-type InP substrate 1 in this order by the metal organic vapor phase epitaxy. The p-type InP second cladding layer 5 and the p-type InGaAs contact layer 6 are processed so as to form a ridge waveguide by the photolithography.

Regions other than a surface of the p-type InGaAs contact layer 6 and a portion of 7 μm from a reflection facet on the p-type InGaAs contact layer 6 are covered with a silicon oxide film 7 which is formed by the plasma CVD. On the silicon oxide film 7, a first conductor layer region 9-1 and a second conductor layer region 9-2 are formed continuously as the p-side electrode 8 by depositing a titanium layer having a thickness of 200 nm, a platinum layer having a thickness of 50 nm and a gold layer having a thickness of 600 nm in this order by vapor deposition. The first and second conductor layer regions except for a portion of 5 μm from the reflection facet are processed so as to leave a ridge upper face and a bonding pad 11. More preferably, a length of the silicon oxide film 7 covering the vicinity of the facet on the p-type InGaAs contact layer may be from 2.5 μm to 9.5 μm, and a recession thereof from the facet of the p-side electrode 8 may be from 0.1 μm to 7.5 μm.

After thinning a bottom face of an n-type InP substrate 1 by grinding to achieve a thickness of 120 μm, an n-side electrode 10 is formed by depositing gold-germanium, nickel, titanium, platinum and gold on the bottom face by vapor deposition. The thus obtained semiconductor laser wafer is cleaved to form a pair of laser cavity facets 13 and 14. An insulator film is formed on each of the cavity facets for the purpose of protection thereof and adjustment of reflectance. The insulator film is not shown in FIG. 10.

As shown in FIG. 6, a semiconductor laser diode 21 is connected, by the junction-up method, to a silicon submount 22 using a gold-tin based solder material, and a diode electrode and a package electrode lead are connected using a gold wire (not shown).

The semiconductor laser diode of the present embodiment operates stably for 5,000 hours in a nitrogen atmosphere of 85° C. under a constant driving condition of 10 mW of light power, and it is estimated that a life thereof is 100,000 hours by extrapolation.

Sixth Embodiment

A tungsten silicide layer may be used for an electrode at the side of a semiconductor layered body of any one of the laser diodes of the present invention. One embodiment thereof will be briefly described below. A basic structure of the present embodiment is the same as that of the first embodiment, for example. Descriptions of a crystal structure and a method of forming a ridge shape are omitted since they are the same as those of the foregoing embodiments, and only a method of fabricating the electrode will be described.

In this embodiment, the electrode on the semiconductor layered body side is formed by depositing a tungsten silicide layer. A contact resistance of the tungsten silicide layer is easily maintained at a constant value, and a degree of mutual diffusion of the tungsten silicide layer with a compound semiconductor material used for the base does not cause troubles in maintaining the characteristics.

The process of fabricating the p-side electrode will be described with reference to FIG. 1. A tungsten silicide layer having a thickness of 300 nm is formed by the argon ion sputtering. Then, the tungsten silicide layer is processed so as to leave an upper face of a ridge and a bonding pad by the reactive ion etching, to thereby achieve a desired shape. A portion having a width of 5 μm from a facet at the side of a reflection facet of a cavity of the ridge upper face on the tungsten silicide layer is reduced in thickness to achieve a thickness of 50 nm. In turn, after thinning a backface of an n-type InP substrate 1 by grinding to achieve a thickness of 120 μm, an n-side electrode 10 is formed by depositing gold-germanium, nickel and gold in this order on the backface by vapor deposition. Other processes are the same as those of the first embodiment. In addition, the cavity facets may be formed by the reactive ion etching. As shown in FIG. 6, a diode is connected to a silicon submount 22 by the junction-up method. In this embodiment, too, the semiconductor laser diode operates stably for 5,000 hours in a nitrogen atmosphere of 80° C. under a constant driving condition of 10 mW of light power, and it is estimated that a life thereof is 100,000 hours by extrapolation.

Seventh Embodiment

An optical transmission module according to the present embodiment will be described below.

Figure 11:
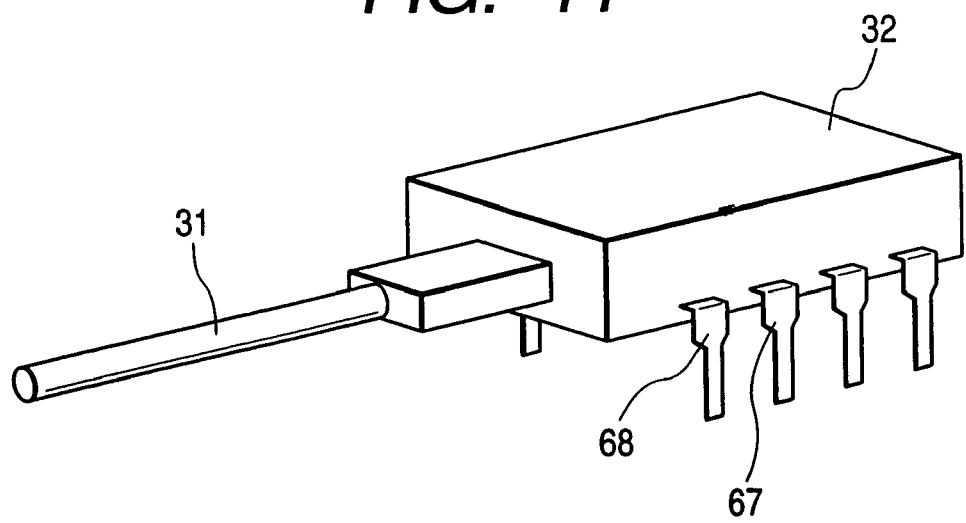
FIG. 11 is a perspective view showing an optical transmission module using the semiconductor laser diode of the present invention.

FIG. 11 is a perspective view showing an optical transmission module using a semiconductor laser diode according to the embodiments of the present invention. The semiconductor laser diode of the present invention is mounted on a silicon substrate in such a manner as to achieve optical coupling with an optical fiber 31 together with a photo diode for monitoring and a thermistor, and is sealed in a ceramic package 32. The semiconductor laser diode used in the present embodiment may be any one of the diodes according to the first, second, third, fourth, fifth and sixth embodiments.

Figure 12:
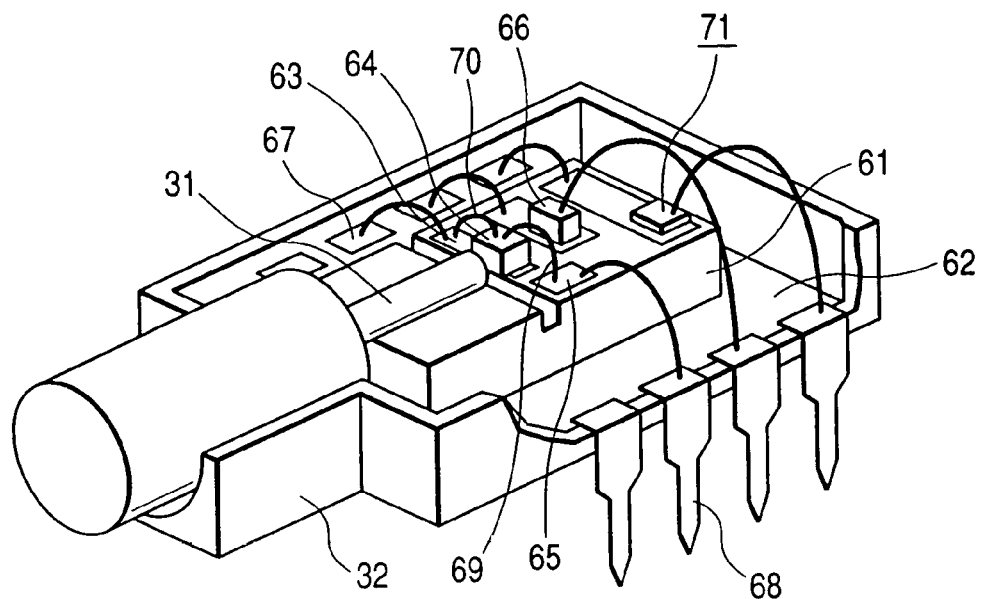
FIG. 12 is a perspective view showing an example of the structure of an optical transmission module.

FIG. 12 is a perspective view showing an example of the module, i.e., the interior of the ceramic package 32 shown in FIG. 11. In FIG. 12, a semiconductor diode portion is shown while omitting a lens system and wiring. A submount 61 is mounted on a heat sink 62 in the ceramic package 32, and a semiconductor laser diode 64 is mounted on the submount 61. One electrode on the diode is connected to a lead 68 via a pad 65. The other electrode is also connected to a lead 67 via a pad 63. In this example, a photo diode 66 and a thermistor 71 are also sealed in the interior of the ceramic package 32. The semiconductor laser diode 64 is electrically connected with the pad 65 and the heat sink 62 by wires 69 and 70.

The semiconductor laser diode of the present invention can be used without a thermoelectric cooler even in the case of operation at a high temperature. When the optical transmission module according to the present embodiment is directly modulated by external driving current pulse signals of 2.5 Gb/s at 25° C. and 60° C., it is confirmed that optical pulse waveforms are uniform since a clear eye opening is obtained in the eye pattern, which is a pattern obtained by overlapping optical output pulse signals respectively generated with respect to current pulse signals.

In another embodiment of the optical transmission module, an integrated circuit element for driving is sealed in the same package together with a photo diode for monitoring and a thermistor. More specifically, the semiconductor laser diode of the present invention is mounted on a silicon substrate in such a manner as to achieve optical coupling with an optical fiber 31 together with a light reception element for monitoring, a thermistor and an integrated circuit element for driving, and is sealed in a ceramic package 32. The semiconductor laser diode used in the present embodiment may be any one of the diodes according to the first, second, third, fourth, fifth and sixth embodiments.

The optical transmission module according to the present embodiment achieves clear eye openings of operational waveforms of 10 Gb/s at 25° C. and 85° C.

The embodiments of the present invention are described hereinbefore. In the ridge-waveguide semiconductor laser diode, an electrode in the vicinity of a reflection facet of the semiconductor laser diode is removed or reduced in its thickness while leaving an electrode required for conduction. Therefore, a tensile strain towards a diode facet due to the electrode is reduced. Owing to the reduction in the tensile strain, bending of a neck portion of the ridge and a generation of dislocation which is one of causes for the degradation are prevented. Since the current density in the vicinity of the reflection facet of the diode is smaller than that of the central area of the diode, carriers on the diode edge portion are reduced in number, to thereby reduce nonradiative recombination. Therefore, generation of heat and light absorption are prevented. The deterioration in emission characteristics of the semiconductor laser diode is prevented owing to the reduction in the current densities on the diode facets and the reduction in the electrode stress.

[Comparison with Known Techniques]

Comparisons between the above-mentioned structures wherein an electrode metal layer facet is recessed inward in the vicinity of the reflection facet and the structure of the present invention will be described. The known techniques are different from the present invention in type of problem to be solved or the structure of the semiconductor laser diode.

The primary object of the present invention is to reduce strain caused by an electrode stress towards a reflection facet of a ridge-waveguide laser diode, to thereby enhance reliability of the diode. Such object is to solve a problem specific to the ridge-waveguide semiconductor laser diode. The object and effect of the present invention are different from those of the known techniques.

For example, the invention disclosed in Japanese Patent Laid-open No. 2000-277846 is limited to a semiconductor laser diode using a nitride semiconductor material, and a substrate used for such semiconductor laser diode does not have the cleavage properties. Therefore, the object of the invention is to prevent peeling of an electrode which is caused by impact accompanying a cleavage in the fabrication of cavity facets and sagging of a main p-side electrode. This invention discloses nothing but the above effect. Japanese Patent Laid-open No. 11-340573 relates to a gallium nitride-based semiconductor laser diode, and Japanese Patent Laid-open No. 10-27939 relates to a nitride semiconductor laser diode. The object mentioned in each of the above publications is the prevention of the peeling of electrode, which is the same as that of the foregoing publication, and does not suggest the effect of the present invention.

Figure 15:
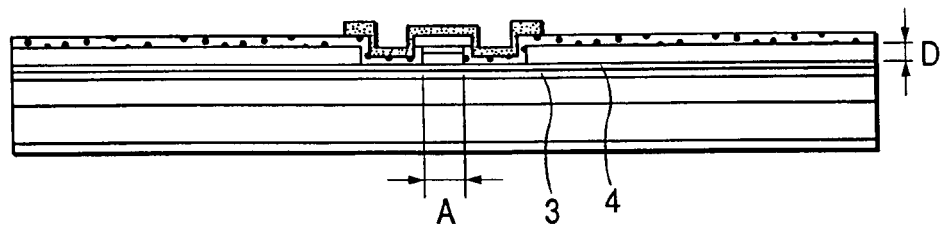
FIG. 15 is a diagram showing the semiconductor laser diode according to the first embodiment of the present invention as viewed from a cavity facet.
Figure 16:
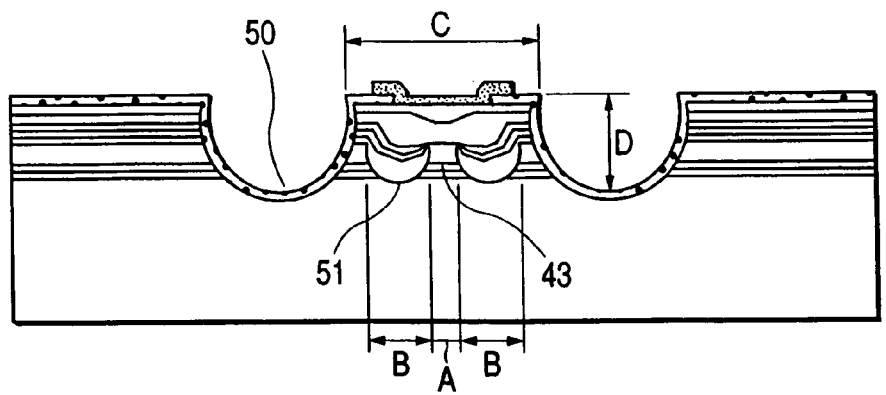
FIG. 16 is a diagram showing the conventional buried heterostructure semiconductor laser diode as viewed from a cavity facet.
Figure 17:
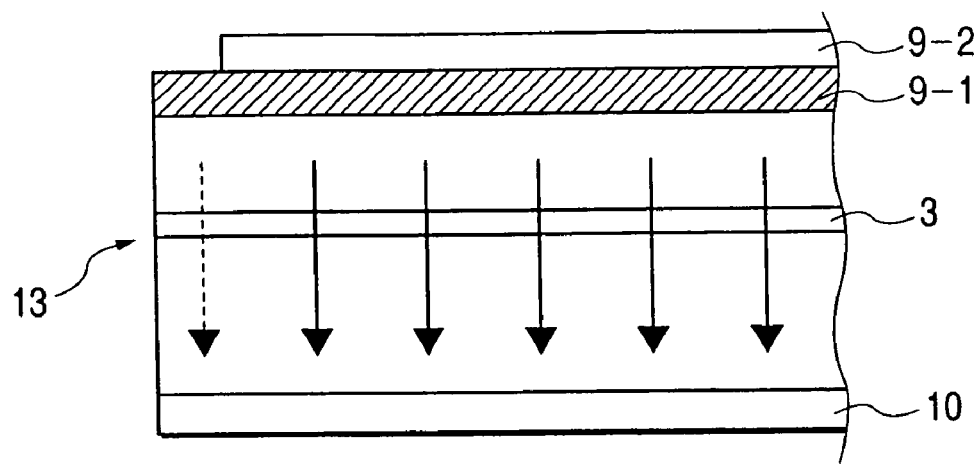
FIG. 17 is a sectional view showing a section parallel with a waveguide of the conventional buried heterostructure semiconductor laser diode wherein an-side electrode metal is recessed in the vicinity of a reflection facet.
Figure 18:
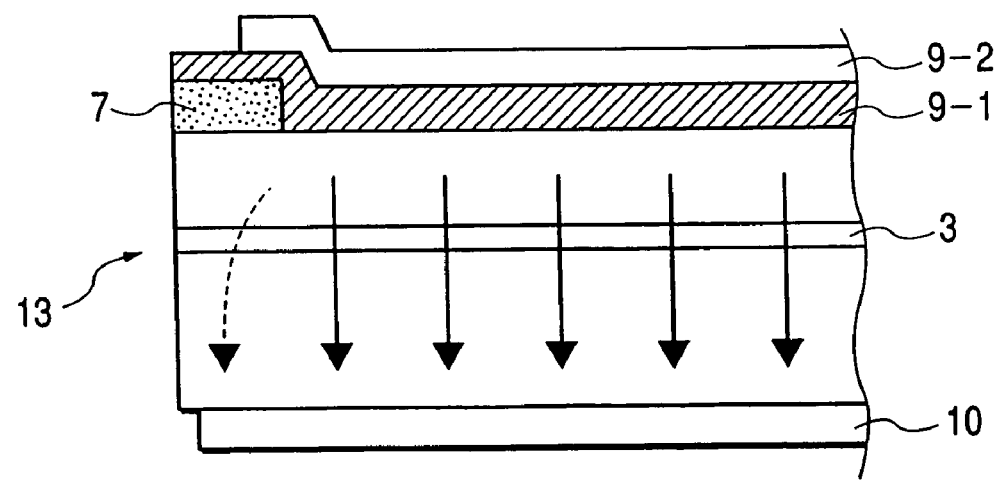
FIG. 18 is a sectional view showing a section parallel with a waveguide of the semiconductor laser diode according to the fifth embodiment of the present invention.

Further, Japanese Patent Laid-open No. 3-206678 discloses a conventional buried heterostructure semiconductor laser structure. For comparison, a ridge-waveguide semiconductor diode of the present invention as viewed from a cavity facet is shown in FIG. 15, and a buried heterostructure semiconductor laser diode as viewed from a cavity facet is shown in FIG. 16. A width A of an active region 3 of FIG. 15 is a width sufficient for confining light and carrier, which is, for example, from about 1 μm to about 2 μm. A height D of the ridge is from about 1 μm to about 2 μm, and a thickness of a p-side cladding layer 4 is 1 μm or less, for example. The width and the height of the ridge are almost identical to each other, and a distance from an electrode to an emission region on the active region is 1 μm or less and, therefore, it is necessary to allow for stress which is caused by the electrode on upper and side faces of the ridge to affect the active region. In turn, a width A of a lasing region 43 of FIG. 16 is sufficient for confining light and carrier, which is, for example, from about 1 μm to about 2 μm. A width B of a buried mesa channel 51 for confining the carriers in the lasing region is about 7 μm, which is disclosed in "ELECTRONICS LETTER, Vol. 18, No. 22, P. 953 (1982)", for example. Also, as disclosed in the above-mentioned Japanese Patent Laid-open No. 3-206678, a width C of a mesa top which is sandwiched between mesa channels 50 is about 30 μm at the maximum, and a depth D of each of the mesa channels 50 is about 9 μm. Therefore, a width of a mesa structure itself is about three times that of its height to be mechanically stable as compared with the ridge-waveguide, and, since a distance from an electrode to an emission region on an active region is about 7 μm and the distance is the same as the width B, it is unnecessary to allow for stress which is caused by the electrode on an upper and side faces of the mesa structure to affect the active region. Since the distance from the electrode to the emission region on the active region is relatively long, the effects of the stress can substantially be ignored, and, thus, problems of the buried heterostructure semiconductor laser diode are different from those of the ridge-waveguide semiconductor laser diode in principle. FIG. 17 is a sectional view showing a section parallel with a waveguide of the conventional buried heterostructure semiconductor laser diode wherein an electrode metal is recessed inward in the vicinity of a reflection facet, and FIG. 18 is a sectional view showing a section parallel with a waveguide of the semiconductor laser diode according to the fifth embodiment of the present invention. A current flows during operation in the manner indicated by arrows in each of the drawings. The broken line arrow indicates that the current is lower in the current density than that of the continuous line arrows. In the structure of FIG. 17, the current flows downwards in the vicinity of a cavity facet 13, and the same applies to the central area of the cavity. In turn, in the structure of FIG. 18, the current flows from a contact portion of an electrode and a semiconductor in a vertical direction due to an insulator film 7 on a cavity facet 13, and the current density is reduced as approaching to the cavity facet 13. In the structure of FIG. 17, a reduction in the current density on the cavity facet is controlled by an electrode thickness achieved by a first conductor layer 9-1 and an electrode facet position set by a second conductor layer 9-2. In the structure of FIG. 18, since it is possible to control the reduction in the current density in the vicinity of the cavity facet 13 by changing an area of the insulator film 7, the saturable absorption does not occur and conditions for suppressing temperature rise on an active region is readily set, to thereby obtain a highly reliable semiconductor laser.

Note:
1. A semiconductor laser diode comprising:
    a semiconductor substrate;
    a semiconductor layered body which is formed on the semiconductor substrate and has at least an active region;
    a first electrode provided on the semiconductor substrate at a side opposite to a side on which the semiconductor layered body is formed; and
    a second electrode provided at the side of the semiconductor layered body;
    wherein:
    the semiconductor layered body has a semiconductor layered portion on an upper region with respect to the active region thereof, the semiconductor layered portion being in the shape of a projection having its length in a light-propagating direction;
    the second electrode on the semiconductor layered body side contacts an upper face of the projected semiconductor layered portion; and
    the second electrode on the semiconductor layered body side includes a facet position of the conductor layer or an end position of the partial region of the electrode which is thicker at a position inside at least one of reflection facets constituting a cavity of the semiconductor laser.

2. The semiconductor laser diode according to the above, wherein the second electrode on the semiconductor layered body side is a tungsten silicide layer.

REFERENCE NUMERALS

1: n-type InP substrate, 2: n-type InAlAS cladding layer, 3: InGaAlAs active region, 4: p-type InAlAs cladding layer, 5; p-type InP cladding layer, 6: p-type InGaAs contact layer, 7: silicon oxide film, 8: p-side electrode, 9-1: first conductor layer of p-side electrode, 9-2: second conductor layer of p-side electrode, 10: n-side electrode, 11: boding pad, 12: marker for positioning, 13: cavity facet, 14: cavity facet, 21: semiconductor laser diode, 22: silicon submount, 31: optical fiber, 32: ceramic package, 41: n-type InP cladding layer, 42: InGaAsP active layer, 43: lasing region, 44: p-type InP cladding layer, 45: p-type InP buried layer, 46: i-type InP buried layer, 47: n-type InP buried layer, 48: p-type InP buried layer, 49: p-type InGaAsP buried layer, 50: mesa channel, 51: buried mesa channel, 61: submount, 62: heat sink, 63: pad, 64: laser diode, 65: pad, 66: photo diode, 67: lead, 68: lead, 69: wire, 70: wire, 71: thermistor.

What is claimed is:
1. A semiconductor laser diode comprising:
    a semiconductor substrate;
    a semiconductor layered body which is formed on the semiconductor substrate and has at least an active region;
    a first electrode provided on the semiconductor substrate at a side opposite to a side on which the semiconductor layered body is formed; and
    a second electrode provided at the side of the semiconductor layered body, wherein the semiconductor layered body has semiconductor layered portion on an upper region with respect to the active region thereof, the semiconductor layered portion being in the shape of a ridge having a length thereof in a light-propagating direction and a cavity under the ridge, the cavity being a laser cavity defined by reflection facets,
    the second electrode on the semiconductor layered portion side contacts an upper face of the semiconductor layered portion,
    the second electrode on the semiconductor layered body side includes a plurality of conductor layers, at least the most outer one of the conductor layers has a length thereof in the light-propagating direction shorter than the length of the semiconductor layered portion,
    the plurality of conductor layers constituting the electrode on the semiconductor layered body side include a first conductor layer region which is close to the semiconductor layered body and a second conductor layer region which is formed on the first conductor layer region,
    the second conductor layer region has a portion having a thickness thinner than that of a central portion thereof in the vicinity of a reflection facet of the laser cavity,
    an edge of the thinner portion at the reflection facet side is located at a position identical with that of an edge of the first conductor layer region, and an edge of the thicker portion at the reflection facet side is recessed inward from a position of the edge of the first conductor layer region.

2. The semiconductor laser diode according to claim 1, wherein the thinner portion of the second conductor layer region is provided at each of the reflection facets of the laser cavity, and the edge of the thinner portion of the second conductor layer region at the reflection facet side is recessed inward from a position of the edge of the first conductor layer region.

3. A semiconductor laser diode comprising:
    a semiconductor substrate;
    a semiconductor layered body which is formed on the semiconductor substrate and has at least an active region;
    a first electrode provided on the semiconductor substrate at a side opposite to a side on which the semiconductor layered body is formed; and
    a second electrode provided at the side of the semiconductor layered body,
    wherein the semiconductor layered body has a semiconductor layered portion on an upper region with respect to the active region thereof, the semiconductor layered portion being in the shape of a ridge having a length thereof in a light-propagating direction and a cavity under the ridge, the cavity being a laser cavity defined by reflection facets,
    the second electrode on the semiconductor layered body side contacts an upper face of the semiconductor layered portion, the second electrode on the semiconductor layered body side includes a plurality of conductor layers, at least the most outer one of the conductor layers has a length thereof in the light-propagating direction shorter than the length of the semiconductor layered portion, the plurality of conductor layers constituting the first electrode on the semiconductor layered body side include a first conductor layer region which is close to the semiconductor layered body and a second conductor layer region which is formed on the first conductor layer region, an insulator film is formed on side faces of the semiconductor layered portion, which are in parallel with the length of the semiconductor layered portion, and upper faces of the semiconductor layered body extending outwardly from the side faces, the first conductor layer region and the second conductor layer region cover the upper face of the semiconductor layered portion and at least a part of the insulator film, an edge of the first conductor layer region at the side of at least one of the reflection facets of the laser cavity is recessed inward from the reflection facet of the laser cavity, and an edge of the second conductor layer region at the side of at least one of the reflection facets of the laser cavity is located at a position identical with that of a position of the edge of the first conductor layer region.

4. The semiconductor laser diode according to claim 3, wherein edges of the first conductor layer region and the second conductor layer region are recessed inward from the reflection facets of the laser cavity at both sides of the reflection facets of the laser cavity.

5. A semiconductor laser diode comprising:
a semiconductor substrates;
a semiconductor layered body which is formed on the semiconductor substrate and has at least an active region;
a first electrode provided on the semiconductor substrate at a side opposite to side on which the semiconductor layered body is formed; and
a second electrode provided at the side of the semiconductor layered body,
wherein the semiconductor layered body has a semiconductor layered portion on an upper region with respect to the active region thereof, the semiconductor layered portion being in the shape of a ridge having a length thereof in a light-propagating direction and a cavity under the ridge, the cavity being a laser cavity defined by reflection facets,
the second electrode on the semiconductor layered body side contacts an upper face of the semiconductor layered portion,
the second electrode on the semiconductor layered body side includes a plurality of conductor layers, at least the most outer one of the conductor layers has a length thereof in the light-propagating direction shorter than the length of the semiconductor levered portion,
the plurality of conductor layers constituting the electrode on the semiconductor layered body side include a first conductor layer region which is close to the semiconductor layered body and a second conductor layer region which is formed on the first conductor layer region,
an insulator film is formed on side faces of the semiconductor layered portion, which are in parallel with the length of the projected semiconductor layered portion, and upper faces of the semiconductor layered body extending outwardly from the side faces, the first conductor layer region covers the upper face of the semiconductor layered portion and at least a part of the insulator film, an edge of the first conductor layer region at the side of at least one of the reflection facets of the laser cavity is recessed inward from the reflection facet of the laser cavity, and an edge of the second conductor layer region at the side of at least one of the reflection facets of the laser cavity is recessed inward from a position of the edge of the first conductor layer region.

6. The semiconductor laser diode according to claim 5, wherein edges of the first conductor layer region at the sides of both of the reflection facets of the laser cavity are recessed inward from the reflection facets of the laser cavity, and edges of the second conductor layer region at the sides of both of the reflection facets of the laser cavity are recessed inward from a position of the edge of the first conductor layer region.

7. A semiconductor laser diode comprising:
a semiconductor substrate;
a semiconductor layered body which is formed on the semiconductor substrate and has at least an active region; a first electrode provided on the semiconductor substrate at a side opposite to a side on which the semiconductor layered body is formed; and
a second electrode provided at the side of the semiconductor layered body,
wherein the semiconductor layered body has a semiconductor layered portion on an upper region with respect to the active region thereof, the semiconductor layered portion being in the shape of a ridge having a length thereof in a light-propagating direction and a cavity under the ridge, the cavity being a laser cavity defined by reflection facets,
the second electrode on the semiconductor layered body side contacts at least an upper face of the semiconductor layered portion,
the second electrode on the semiconductor layered body side includes a plurality of conductor layers, the plurality of conductor layers comprising a first conductor layer region which is close to the semiconductor layered body and a second conductor layer region which is formed on the first conductor layer region,
an insulator film is formed on a portion of at least one of the reflection facets of a laser cavity on the upper face of the semiconductor layered portion, side faces of the semiconductor layered portion, which are in parallel with the length of the semiconductor layered portion, and upper faces of the semiconductor layered body extending outwardly from the side faces, the first conductor layer region covers the upper face of the semiconductor layered portion and at least a part of the insulator film,
an edge of the first conductor layer region at the side of at least one of the reflection facets of the laser cavity is recessed inward from the reflection facet of the laser cavity,
an edge of the second conductor layer region at the side of at least one of the reflection facets of the laser cavity is located at a position identical with a position of the edge of the first conductor layer region,
one facet of the insulator film formed on a part of the upper face of the semiconductor layered portion is located at a position identical with that of the reflection facet of the laser cavity, and other facet of the insulator film formed on a part of the upper face of the semiconductor layered portion is located at a position identical with or recessed inward from a position of the edge of the first conductor layer region.

8. The semiconductor laser diode according to claim 7, wherein edges of the first conductor layer region and the second conductor layer region are recessed inward from the reflection facets of the laser cavity at both sides of the reflection facets of the laser cavity, and the insulator film is formed on a portion of each of the reflection facets of the laser cavity on the upper face of the semiconductor layered body.

9. The semiconductor laser diode according to claim 7, wherein the plurality of conductor layers include a first conductor layer region which is close to the semiconductor layered body and a second conductor layer region which is formed on the first conductor layer region, an insulator film is formed on a portion of at least one of the reflection facets of the laser cavity formed on the upper face of the semiconductor layered portion, side faces of the semiconductor layered portion, which are in parallel with the length of the semiconductor layered portion, and upper faces of the semiconductor layered body extending outwardly from the side faces, the first conductor layer region covers the upper face of the semiconductor layered portion and at least a part of the insulator film; an edge of the first conductor layer region at the side of at least one of the reflection facets of the laser cavity is recessed inward from the reflection facet of the laser cavity, an edge of the second conductor layer region at the side of at least one of the reflection facets of the laser cavity is recessed inward from a position of the edge of the first conductor layer region, one facet of the insulator film formed on the upper face of the semiconductor layered body is located at a position identical with that of the reflection facet of the laser cavity, and other facet of the insulator film formed on the upper face of the semiconductor layered body is located at a position identical with or recessed inward from a position of the edge of the first conductor layer region.

10. The semiconductor laser diode according to claim 9, wherein edges of the first conductor layer region at the sides of both of the reflection facets of the laser cavity are recessed inward from the reflection facets of the laser cavity, edges of the second conductor layer region at the sides of both of the reflection facets of the laser cavity are recessed inward from edge positions of the first conductor layer region, and the insulator film is formed on a portion of each of the reflection facets of the laser cavity on the upper face of the semiconductor layered portion.

11. A semiconductor laser diode comprising:
a semiconductor substrate;
a semiconductor layered body which is formed on the semiconductor substrate and has at least an active region;
a first electrode provided on the semiconductor substrate at a side opposite to a side on which the semiconductor layered body is formed; and
a second electrode provided at the side of the semiconductor layered body, wherein the semiconductor layered body has a semiconductor layered portion on an upper region with respect to the active region thereof, the semiconductor layered portion being in the shape of a ridge having a length thereof in a light-propagating direction and a cavity under the ridge, the cavity being a laser cavity defined by reflection facets,
the second electrode on the semiconductor layered body side contacts an upper face of the semiconductor layered portion,
the second electrode on the semiconductor layered body side includes a plurality of conductor layers, at least the most outer one of the conductor layers has a length thereof in the light-propagating direction shorter than the length of the semiconductor layered portion, and
the plurality of conductor layers constituting the electrode on the semiconductor layered body side include a first conductor layer region and a second conductor layer region which is formed on the first conductor layer region, the first conductor layer region having a plurality of layers of a titanium layer and a platinum layer or a plurality of layers of a titanium layer and a nickel layer and the second conductor layer region being a gold layer.

12. A semiconductor laser diode comprising
a semiconductor substrate;
a semiconductor layered body which is formed on the semiconductor substrate and has at least an active region;
a first electrode provided on the semiconductor substrate at a side opposite to a side on which the semiconductor layered body is formed; and
a second electrode provided at the side of the semiconductor layered body, wherein the semiconductor layered body has semiconductor layered portion on an upper region with respect to the active region thereof, the semiconductor layered portion being in the shape of a ridge having a length thereof in a light-propagating direction and a cavity under the ridge, the cavity being a laser cavity defined by reflection facets,
the second electrode on the semiconductor layered portion side contacts an upper face of the semiconductor layered portion,
the second electrode on the semiconductor layered body side includes a plurality of conductor layers, at least the most outer one of the conductor layers has a length thereof in the light-propagating direction shorter than the length of the semiconductor layered portion, and
the second electrode on the semiconductor layered body side includes a tungsten silicide layer.

13. A semiconductor laser diode comprising:
a semiconductor substrate;
a semiconductor layered body which is formed on the semiconductor substrate and has at least an active region;
a first electrode provided on the semiconductor substrate at a side opposite to a side on which the semiconductor layered body is formed; and
a second electrode provided at the side of the semiconductor layered body, wherein the semiconductor layered body has a semiconductor layered portion on an upper region with respect to the active region thereof, the semiconductor layered portion being in the shape of a ridge having a length thereof in a light-propagating direction and a cavity under the ridge, the cavity being a laser cavity defined by reflection facets, the second electrode on the semiconductor layered body side contacts an upper face of the semiconductor layered portion, the second electrode on the semiconductor layered body side includes a pluraltiy of conductor layers, at least the most outer one of the conductor layers has a length thereof in the light-propagating direction shorter than the length of the semiconductor layered portion, the plurality of conductor layers constituting the electrode on the semiconductor layered body side include a first conductor layer region which is close to the semiconductor layered body and a second conductor layer region which is formed on the first conductor layer region, and the product of a distance from the edge of the first conductor layer region at the side of the reflection facet of the laser cavity to the edge of the second conductor layer region at the side of the reflection facet of the laser cavity and a sheet resistance of the first conductor layer region is 2 Ωmm or less.

* * * * *